United States Patent
Konno

(10) Patent No.: US 8,648,435 B2
(45) Date of Patent: Feb. 11, 2014

(54) SOLID-STATE IMAGING DEVICE AND METHOD FOR MANUFACTURING SAME

(75) Inventor: Yusaku Konno, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 587 days.

(21) Appl. No.: 12/726,718

(22) Filed: Mar. 18, 2010

(65) Prior Publication Data
US 2010/0244167 A1 Sep. 30, 2010

(30) Foreign Application Priority Data

Mar. 24, 2009 (JP) ................................. 2009-72853

(51) Int. Cl.
*H01L 31/0232* (2006.01)
*H01L 31/062* (2012.01)

(52) U.S. Cl.
USPC .......................................... 257/432; 257/294

(58) Field of Classification Search
USPC .................. 257/292, 294, 432, 435, E21.211, 257/E31.127
See application file for complete search history.

(56) References Cited

U.S. PATENT DOCUMENTS

| | | | |
|---|---|---|---|
| 2006/0115230 A1* | 6/2006 | Komoguchi et al. | 385/146 |
| 2009/0136174 A1* | 5/2009 | Itahashi | 385/14 |

FOREIGN PATENT DOCUMENTS

| | | |
|---|---|---|
| JP | 9-134891 | 5/1997 |
| JP | 2002-118245 | 4/2002 |
| JP | 2003-174155 | 6/2003 |
| JP | 2006-49825 | 2/2006 |
| JP | 2006-261249 | 9/2006 |
| JP | 2006-319037 | 11/2006 |
| JP | 2007-317859 | 12/2007 |
| JP | 2008-91643 | 4/2008 |
| JP | 2008-109393 | 5/2008 |
| JP | 2008-166677 | 7/2008 |

OTHER PUBLICATIONS

Office Action Issued Apr. 20, 2011 in Japan Application No. 2009-072853 (With English Translation).
Office Action issued on Jul. 19, 2011 in the corresponding Japanese Patent Application No. 2009-072853 (with English Translation).

* cited by examiner

*Primary Examiner* — Hung Vu
(74) *Attorney, Agent, or Firm* — Oblon, Spivak, McClelland, Maier & Neustadt, L.L.P.

(57) ABSTRACT

A solid-state imaging device includes: a substrate including a plurality of light receiving sections; an optical waveguide provided above each of the plurality of light receiving sections and surrounded by a cladding layer; a color filter provided above each of the optical waveguides; and a lens provided above the color filter, the optical waveguide including a first layer having a first refractive index and a second layer being in contact with the first layer and having a second refractive index higher than the first refractive index.

12 Claims, 7 Drawing Sheets

SOLID-STATE IMAGING DEVICE AND METHOD FOR MANUFACTURING SAME

CROSS-REFERENCE TO RELATED APPLICATIONS

This application is based upon and claims the benefit of priority from the prior Japanese Patent Application No. 2009-72853, filed on Mar. 24, 2009; the entire contents of which are incorporated herein by reference.

BACKGROUND

1. Field

Embodiments of the invention relate generally to a solid-state imaging device and a method for manufacturing the same.

2. Background Art

Solid-state imaging devices have recently been finding widespread application not only in digital cameras, but also in cell phones and various other mobile terminals, surveillance cameras, and web cameras for chatting through the Internet.

Such solid-state imaging devices are required to achieve low power consumption and small size. As a solid-state imaging device satisfying these requirements, a CMOS (complementary metal oxide semiconductor) area sensor (hereinafter referred to as CMOS sensor), a CCD (charge-coupled device) area sensor, or the like is drawing attention.

In an example of the CMOS sensor, a light receiving section made of a photodiode or the like is formed in the surface portion of a silicon substrate, and a multilayer wiring layer is formed on the silicon substrate outside the light receiving section. Furthermore, a trench is formed immediately above the light receiving section, and an optical waveguide for guiding light to the light receiving section is placed inside this trench (see, e.g., JP-A 2007-317859 (Kokai)).

In this type of solid-state imaging device, a microlens for focusing light and a color filter for transmitting light only in a particular wavelength range are provided above the optical waveguide. On the other hand, the pitch reduction (miniaturization) of solid-state imaging devices is advancing rapidly to achieve higher resolution. Accordingly, the width of the optical waveguide is also narrowed.

However, with the narrowing of the optical waveguide width, filling failure of the optical waveguide material occurs, causing a problem of decreasing the light receiving efficiency of the solid-state imaging device.

SUMMARY

According to an aspect of the invention, there is provided a solid-state imaging device including: a substrate including a plurality of light receiving sections; an optical waveguide provided above each of the plurality of light receiving sections and surrounded by a cladding layer; a color filter provided above each of the optical waveguides; and a lens provided above the color filter, the optical waveguide including a first layer having a first refractive index and a second layer being in contact with the first layer and having a second refractive index higher than the first refractive index.

According to another aspect of the invention, there is provided a method for manufacturing a solid-state imaging device including: a substrate including a plurality of light receiving sections; an optical waveguide provided above each of the plurality of light receiving sections and surrounded by a cladding layer; a color filter provided above the optical waveguide; and a lens provided above the color filter, the optical waveguide including a first layer having a first refractive index and a second layer being in contact with the first layer and having a second refractive index higher than the first refractive index, the method including: forming the second layer under a reduced-pressure atmosphere; removing an upper portion of the second layer by performing etch-back on the upper portion of the second layer; and forming the first layer on the second layer.

DETAILED DESCRIPTION

Embodiments of the invention will now be described with reference to the drawings.

First Embodiment

Figure 1A:
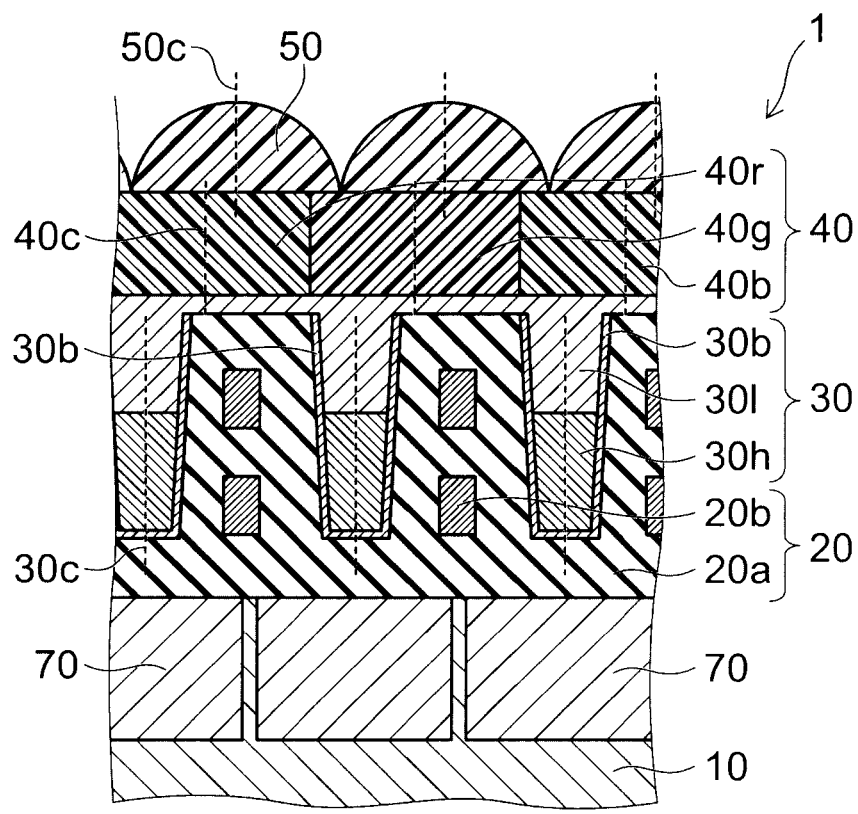
FIGS. 1A and 1B are schematic views of the relevant part of a solid-state imaging device according to an embodiment.
Figure 1B:
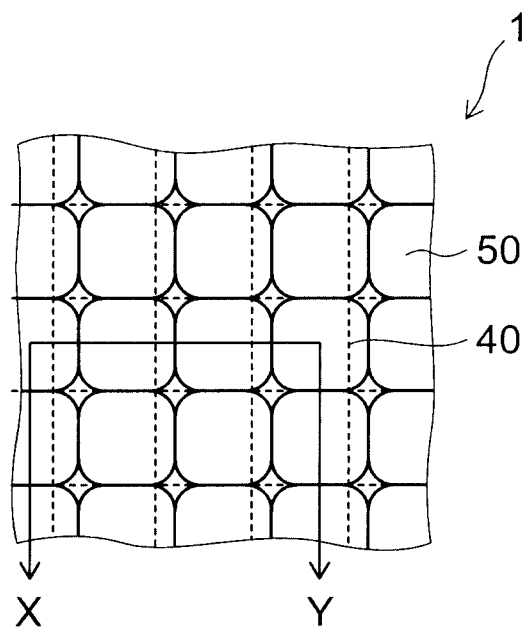

FIGS. 1A and 1B are schematic views of the relevant part of a solid-state imaging device according to an embodiment. FIG. 1A is a cross-sectional view of the relevant part of the solid-state imaging device, and FIG. 1B is a plan view of the relevant part of the solid-state imaging device. Here, FIG. 1A shows the X-Y cross-section of FIG. 1B.

As shown in FIGS. 1A and 1B, in a solid-state imaging device 1, a silicon (Si) substrate 10 is used as its base material, and a photodiode 70 serving as a light receiving section is formed in part of the surface portion of the silicon substrate 10. A PN junction, for instance, is formed inside such a photodiode 70.

The photodiode 70 is shaped like a square, for instance, as viewed in a direction perpendicular to the major surface of the silicon substrate 10. A plurality of photodiodes 70 are arranged in a matrix in the plane of the solid-state imaging device 1.

In addition, the diffusion layer of the CCD or CMOS transistor serving as a charge transfer section is formed in the silicon substrate 10 (not shown).

Furthermore, the solid-state imaging device 1 includes a multilayer wiring layer 20 above the silicon substrate 10. The multilayer wiring layer 20 includes an interlayer insulating film 20a functioning as an optical cladding layer as well as an insulating material, and wirings 20b are arranged in multiple layers in this interlayer insulating film 20a. These wirings 20b function also as a light shielding film. Here, a dedicated light shielding film may be formed in the multilayer wiring layer 20 (not shown). Furthermore, a transfer electrode for transfer to the charge transfer section may be formed in the multilayer wiring layer 20 (not shown).

Furthermore, in the solid-state imaging device 1, a columnar optical waveguide 30 is formed in the multilayer wiring layer 20 immediately above the photodiode 70. That is, the optical waveguide 30 is surrounded by the interlayer insulating film 20a. The outer edge of this optical waveguide 30 is placed inside the photodiode 70. Here, the outer edge of the optical waveguide 30 may be substantially aligned with the outer edge of the photodiode 70. The optical waveguide 30 is not in contact with the wiring 20b, and there are no members such as wirings, transfer electrodes, and light shielding films inside the optical waveguide 30. The optical waveguide 30 is composed of a plurality of layers in such a configuration that, for instance, a plurality of layers with different refractive indices are stacked.

For instance, in the solid-state imaging device 1, as shown, the optical waveguide 30 is composed of two layers. The lower part of the optical waveguide 30 is illustratively filled with a high refractive index layer (a second layer) 30h, and a low refractive index layer (a first layer) 30l is formed on the high refractive index layer 30h. The optical waveguide 30 is formed by stacking the first layer on the second layer. Here, the number of layers is not limited to two, but each of the layers may be further divided into a plurality of stages. In this case, a layer having a relatively lower refractive index is placed at a higher position of the optical waveguide 30.

Furthermore, in the solid-state imaging device 1, a color filter 40 for absorbing light of a particular wavelength is placed on the optical waveguide 30. For instance, a blue color filter 40b, a green color filter 40g, and a red color filter 40r are placed on the respective optical waveguides 30. Furthermore, a microlens 50 in the form of a convex lens is placed on the color filter 40. The color filter 40 is illustratively shaped like a square, and the microlens 50 is illustratively shaped like a square with rounded corners.

The photodiode 70, the optical waveguide 30, the color filter 40, and the microlens 50 are arranged in a lattice pattern in FIGS. 1A and 1B. However, it is also possible to use a honeycomb pattern with respect to the major surface of the substrate 10. Furthermore, in each solid-state imaging element constituting the solid-state imaging device 1, the central axis 30c of the optical waveguide 30, the central axis 40c of the color filter 40, and the central axis 50c of the microlens 50 are shifted to achieve the so-called scaling effect. This is intended to allow the light beam injected through the imaging lens toward the microlens 50 obliquely at a large incident angle to be efficiently focused on the solid-state imaging device 1 because a certain distance exists from the microlens 50 to the photodiode 70 by the presence of the color filter 40 and the like.

It is noted that this embodiment also encompasses a configuration in which the central axis 30c, the central axis 40c, and the central axis 50c are aligned. For instance, the solid-state imaging device 1 may be configured so that solid-state imaging elements with the central axis 30c, the central axis 40c, and the central axis 50c aligned with each other are placed near its center, whereas solid-state imaging elements with the central axis 30c, the central axis 40c, and the central axis 50c shifted from each other are placed near the outer periphery of the solid-state imaging device 1.

The width of each solid-state imaging element 1a (the width in a direction generally parallel to the major surface of the silicon substrate 10) constituting the solid-state imaging device 1 is 1.4 to 1.8 μm. The pitch of the optical waveguides 30 arranged in the multilayer wiring layer 20 is 1.4 to 1.8 μm, and the thickness of the optical waveguide 30 (the depth of the trench 60) is e.g. 1.5 μm. The width of the upper surface of the optical waveguide 30 is e.g. approximately 1.0 μm, and the width of the lower surface of the optical waveguide 30 (the bottom surface of the trench 60) is approximately 0.8 μm.

The thickness of the multilayer wiring layer 20 is e.g. 2 to 3 μm, the thickness of the color filter 40 is e.g. approximately 1.0 μm, and the thickness of the microlens 50 is e.g. 0.5 μm or less.

The material of the interlayer insulating film 20a is illustratively formed from an insulating material such as $SiO_2$ (with a refractive index of approximately 1.4).

The material of the wiring 20b is illustratively formed from a high melting temperature metal such as copper (Cu), titanium (Ti), molybdenum (Mo), and tungsten (W), or a silicide of a high melting temperature metal such as TiSi, MoSi, and WSi.

The material used for the high refractive index layer 30h is illustratively silicon nitride (SiN) having a refractive index of approximately 1.9.

The material used for the low refractive index layer 30l is illustratively a thermosetting polymer organic material (with a refractive index of approximately 1.6), which includes at least one of a polyimide resin, poly(benzyl methacrylate), poly(phenyl methacrylate), poly(diallyl phthalate), and polystyrene.

The material used for the protective film 30b is illustratively silicon nitride (SiN).

Next, a process for forming the optical waveguide 30 having a multilayer structure is described.

FIGS. 2A to 2D are schematic cross-sectional views of the relevant part for describing the process for forming the optical waveguide.

Figure 2A:
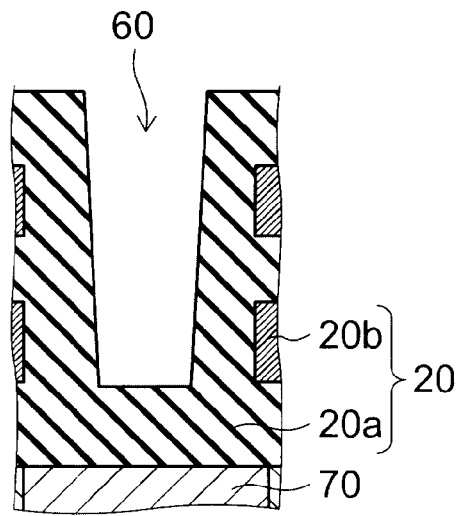
FIGS. 2A to 2D are schematic cross-sectional views of the relevant part for describing the process for forming an optical waveguide.

For instance, as shown in FIG. 2A, a multilayer wiring layer 20 is formed on a photodiode 70. Then, a selective RIE (reactive ion etching) treatment is performed on this multilayer wiring layer 20 to form a trench 60 immediately above the photodiode 70. Such a trench 60 inevitably has high aspect ratio in view of the current progress of miniaturization of the solid-state imaging device 1. For instance, the cross section of the trench 60 (cut generally perpendicular to the major surface of the substrate 10) has an inversely tapered shape, with the width of the trench 60 narrowed toward the bottom.

Figure 2B:
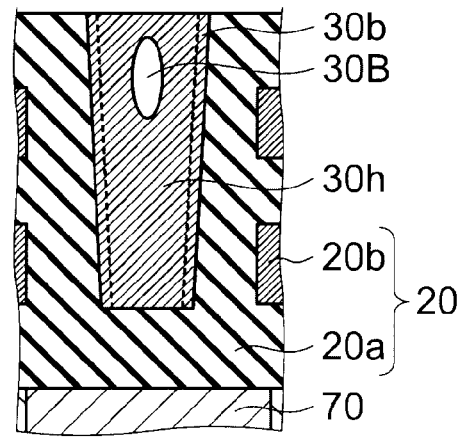

Next, as shown in FIG. 2B, a protective film 30b is formed on the inner wall of the trench 60. Then, a high refractive index layer 30h is buried to halfway through the depth of the trench 60 illustratively by a film formation method under a reduced-pressure atmosphere, such as CVD (chemical vapor deposition) and sputtering. The protective film 30b is intended to suppress degradation of the wirings 20b during the process for forming the optical waveguide 30. The protective film 30b is formed by the sputtering process or the CVD process.

Here, FIG. 2B assumes the case where the high refractive index layer 30h is formed to the top of the trench 60 under a reduced-pressure atmosphere. Thus, FIG. 2B shows the case where the aforementioned filling failure occurs in this high refractive index layer 30h and generates a void 30B in the upper part of the trench 60.

Figure 2C:
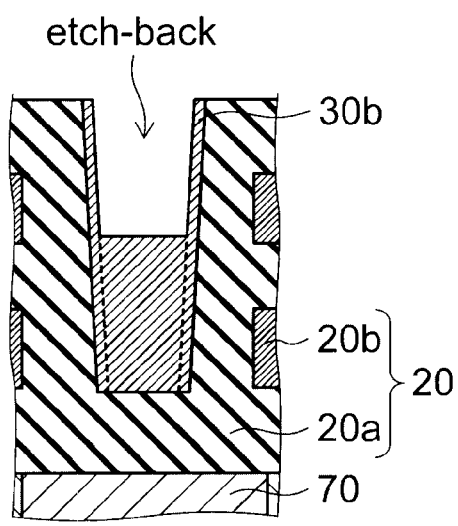

Next, as shown in FIG. 2C, a selective etch-back treatment is performed on the high refractive index layer 30h to remove the upper portion of the high refractive index layer 30h where the void 30B is generated. Thus, a hole portion EB is formed above the high refractive index layer 30h. It is noted that instead of using film formation under a reduced-pressure atmosphere, a coating process can illustratively be used to form a high refractive index layer 30h directly to the position illustrated in FIG. 2C.

Figure 2D:
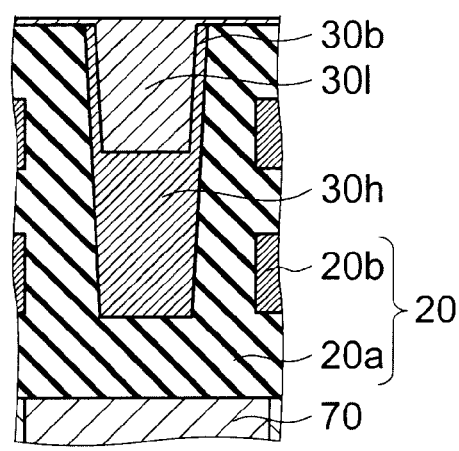

Then, an organic polymer material is illustratively buried (not shown) in the hole portion EB by a coating process (such as spin coating and dipping). At this stage, the organic polymer material is in the melt state and has low viscosity, exhibiting good filling and coverage capability in the trench 60 having high aspect ratio. Then, the organic polymer material is heat cured to form a low refractive index layer 30l on the high refractive index layer 30h. This state is shown in FIG. 2D.

Thus, the trench 60 is filled with a stacked body including the high refractive index layer 30h and the low refractive index layer 30l, which constitute an optical waveguide 30.

It is noted that the process for forming the protective film 30b may be omitted as necessary. Furthermore, the cross section of the trench 60 may have a straight shape as necessary.

By the foregoing process, the optical waveguide 30 is formed.

In such a solid-state imaging device 1, the high refractive index layer 30h and the low refractive index layer 30l can be reliably buried even inside the trench 60 formed with high aspect ratio. In particular, in the solid-state imaging device 1, the high refractive index layer 30h is placed in the lower part of the trench 60 where the width of the trench 60 is narrower.

Figure 3:
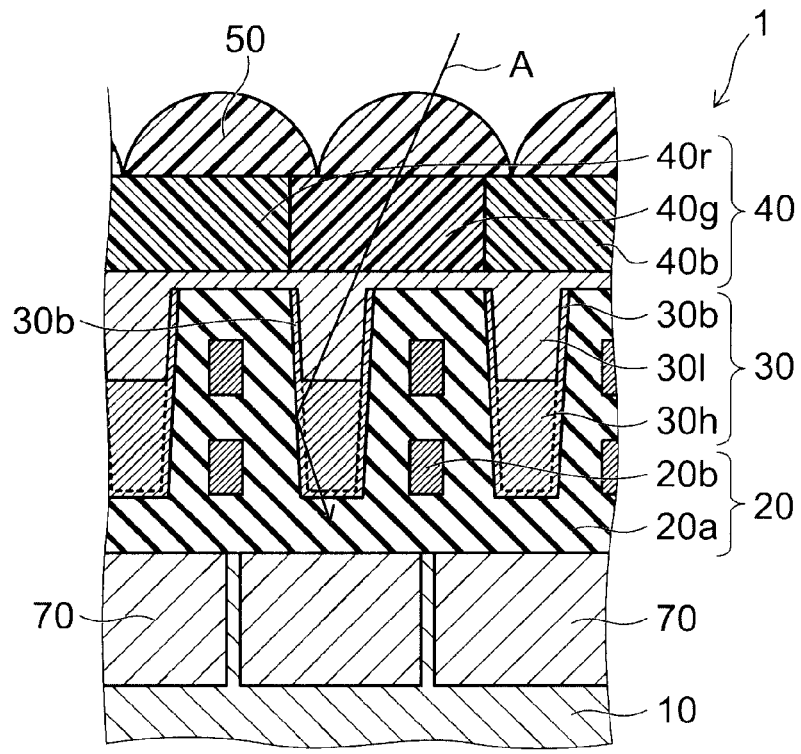
FIG. 3 is a diagram of the relevant part for describing the effect of the solid-state imaging device.

This improves the total reflection effect of light guided through the microlens 50 and the color filter 40 to the lower part of the optical waveguide 30. For instance, as illustrated in FIG. 3, the light (light beam A) guided through the microlens 50 and the color filter 40 to the lower part of the optical waveguide 30 efficiently reaches the photodiode 70 by total reflection in the lower part of the optical waveguide 30, which is improved because the high refractive index layer 30h is placed in the lower part of the optical waveguide 30.

In other words, in the solid-state imaging device 1, by burying the high refractive index layer 30h in the lower part of the trench 60, the apparent opening width of the narrow portion in the lower part of the trench 60 is widened. This significantly increases the light receiving efficiency of the solid-state imaging device 1.

In this context, it is also contemplated to entirely fill the trench 60 with the high refractive index layer 30h. However, in the case of entirely filling the trench 60 with the high refractive index layer 30h, because of its high viscosity and the like, a void may be generated in the optical waveguide 30 formed in the trench 60. Such a void is more likely to occur in the optical waveguide 30 as the aspect ratio of the trench 60 increases. If such a void exists in the optical waveguide 30, the apparent refractive index of the optical waveguide 30 decreases even though the trench 60 is filled with the high refractive index layer 30h. Conversely, if the trench 60 is entirely filled with a low refractive index layer 30l having good filling capability, the light receiving efficiency decreases.

Therefore, in the solid-state imaging device 1, in the process for forming the optical waveguide 30 having high aspect ratio, the high refractive index layer 30h is buried to such a level as to avoid generation of voids (i.e., to halfway through the depth of the trench 60), and the low refractive index layer 30l is subsequently buried thereon.

Thus, because the optical waveguide material is buried in the trench 60 in multiple times, generation of voids in the trench 60 can be suppressed. Hence, despite the miniaturization of the solid-state imaging element, a solid-state imaging device with high light receiving efficiency and high reliability is realized.

Next, a solid-state imaging device according to another embodiment, different from the solid-state imaging device 1, is described. In the figures described below, the same components as those in the solid-state imaging device 1 are labeled with like reference numerals, and the detailed description thereof is omitted.

Second Embodiment

Figure 4:
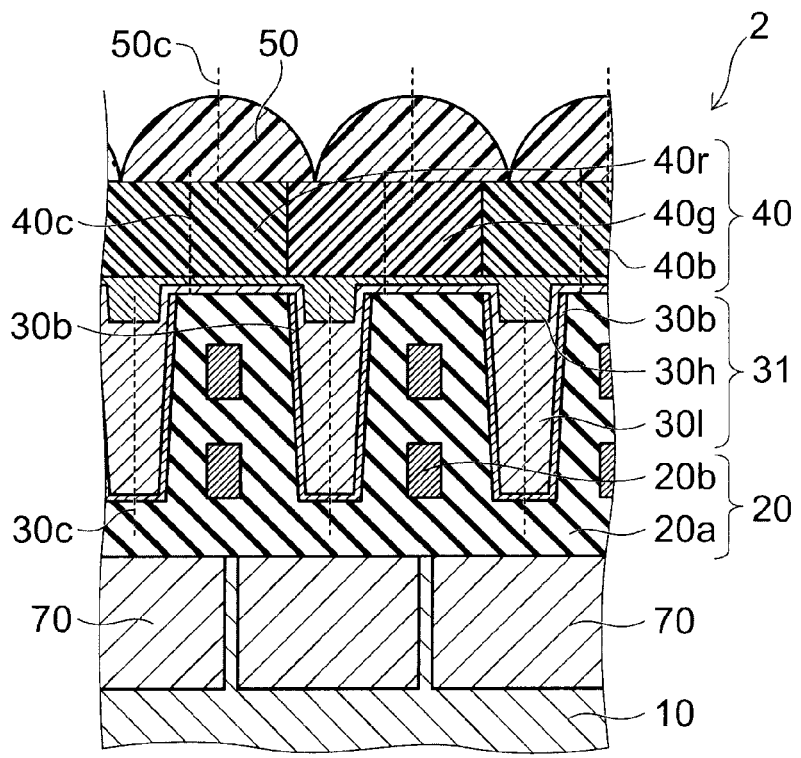
FIG. 4 is a schematic view of the relevant part of a solid-state imaging device according to an embodiment.

FIG. 4 is a schematic view of the relevant part of a solid-state imaging device according to another embodiment.

As shown in FIG. 4, in a solid-state imaging device 2, a columnar optical waveguide 31 is formed in a multilayer wiring layer 20 immediately above a photodiode 70. That is, the optical waveguide 31 is surrounded by an interlayer insulating film 20a. The outer edge of this optical waveguide 31 is substantially aligned with the outer edge of the photodiode 70, or placed inside it. The optical waveguide 31 is not in contact with the wiring 20b, and there are no members such as wirings, transfer electrodes, and light shielding films inside it. The optical waveguide 31 is composed of a plurality of layers in such a configuration that, for instance, a plurality of layers with different refractive indices are stacked.

For instance, in the solid-state imaging device 2, as shown, the optical waveguide 31 is composed of two layers. The lower part of the optical waveguide 31 is illustratively filled with a low refractive index layer 30l, and a high refractive index layer 30h is formed on the low refractive index layer 30l. The optical waveguide 31 is formed by stacking the second layer on the first layer. Here, the number of layers is not limited to two, but each of the layers may be further divided into a plurality of stages. In this case, a layer having a relatively higher refractive index is placed at a higher position of the optical waveguide 31.

Such an optical waveguide 31 is formed illustratively by the following process.

Figure 5A:
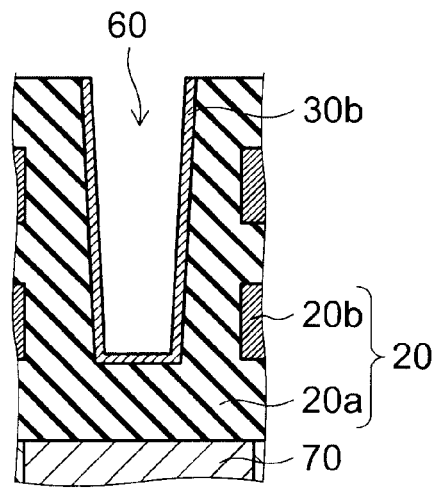
FIGS. 5A to 5C are schematic cross-sectional views of the relevant part for describing the process for forming an optical waveguide.
Figure 5B:
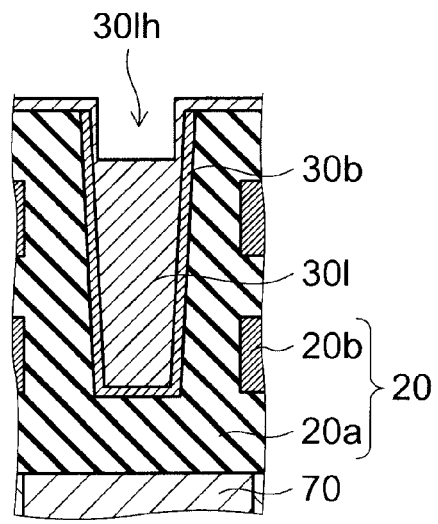
Figure 5C:
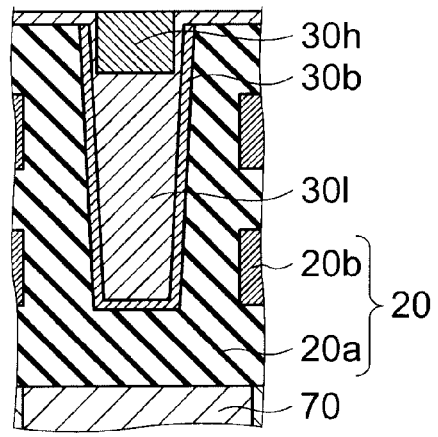

FIGS. 5A to 5C are schematic cross-sectional views of the relevant part for describing the process for forming the optical waveguide.

For instance, as shown in FIG. 5A, after a multilayer wiring layer 20 is formed, a selective RIE treatment is performed on this multilayer wiring layer 20 to form a trench 60 immediately above the photodiode 70. The cross section of such a trench 60 has an inversely tapered shape, with the width of the trench 60 narrowed toward the bottom. Here, the cross section of the trench 60 may have a straight shape as necessary. A protective film 30b is formed on the inner wall of the trench 60.

Next, an organic polymer material is illustratively buried to halfway through the depth of the trench 60 by a coating process (such as spin coating and dipping). At this stage, the organic polymer material is in the melt state and has low viscosity, exhibiting good filling, and coverage capability in the trench 60 having high aspect ratio. Then, the organic polymer material is heat cured to form a low refractive index layer 30l to halfway through the depth of the trench 60. This state is shown in FIG. 5B. A hole portion 30lh surrounded by the low refractive index layer 30l is formed in the upper part of the trench 60.

With regard to the state of FIG. 5B, alternatively, the hole portion 30lh may be formed by etching back the low refractive index layer 30l after the trench 60 is filled with the low refractive index layer 30l.

Next, a similar coating and heat curing process is repeated to form, for instance, a high refractive index layer 30h in the hole portion 30lh. This state is shown in FIG. 5C. Alternatively, this stage of forming the high refractive index layer 30h may be based on such a low-temperature CVD or low-temperature sputtering process as to avoid thermal damage to the low refractive index layer 30l temporarily buried in the trench 60.

Thus, the trench 60 is filled with a stacked body including the low refractive index layer 30l and the high refractive index layer 30h, which constitute an optical waveguide 31.

In such a solid-state imaging device 2, the low refractive index layer 30l and the high refractive index layer 30h can be reliably buried even inside the trench 60 formed with high aspect ratio. In particular, in the solid-state imaging device 2, the high refractive index layer 30h is placed in the upper part of the trench 60.

In such a solid-state imaging device 2, the light receiving efficiency for light obliquely incident with respect to the substrate 10 can be increased.

Figure 6:
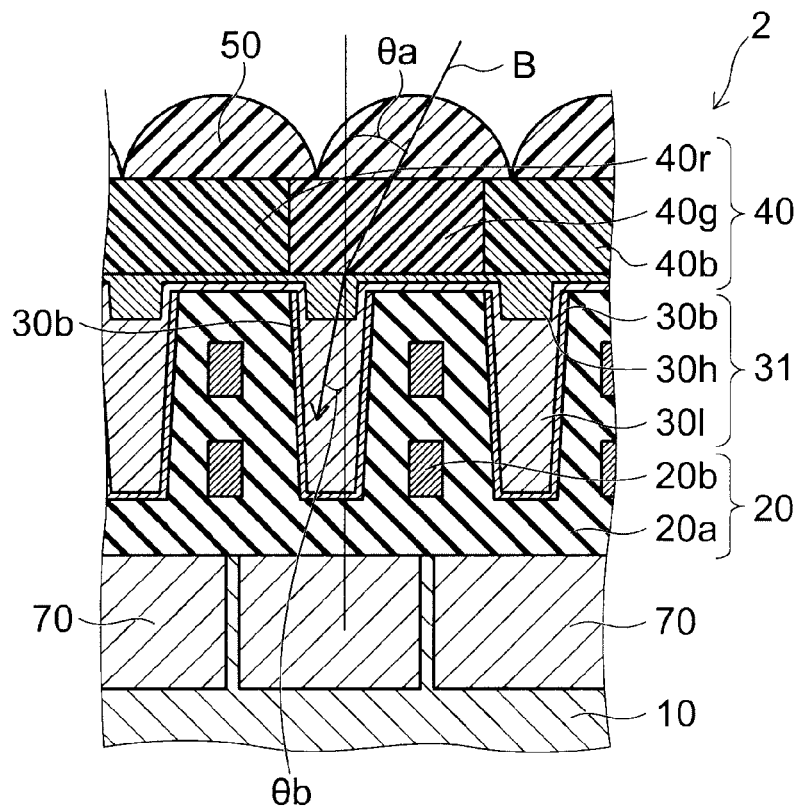
FIG. 6 is a diagram of the relevant part for describing the effect of the solid-state imaging device.

For instance, as shown in FIG. 6, the angle between the normal to the major surface of the substrate 10 and the incident light is denoted by θa (incident angle), and the angle between the normal and the refracted light is denoted by θb (refraction angle). In the solid-state imaging device 2, because the high refractive index layer 30h is placed in the upper part of the trench 60, the incident angle θa of the light beam B refracted by this high refractive index layer 30h and injected into the optical waveguide 31 can be increased.

In other words, the flexibility (margin) of the incident angle θa of light obliquely incident on the microlens 50 is increased, and the light receiving efficiency of the solid-state imaging device 2 is significantly improved.

Furthermore, in the solid-state imaging device 2, in the process for forming the optical waveguide 31 having high aspect ratio, the optical waveguide material is buried in the trench 60 in multiple times. Thus, generation of voids in the trench 60 can be suppressed (described above). Hence, despite the miniaturization of the solid-state imaging element, a solid-state imaging device with high light receiving efficiency and high reliability is realized.

Third Embodiment

Figure 7:
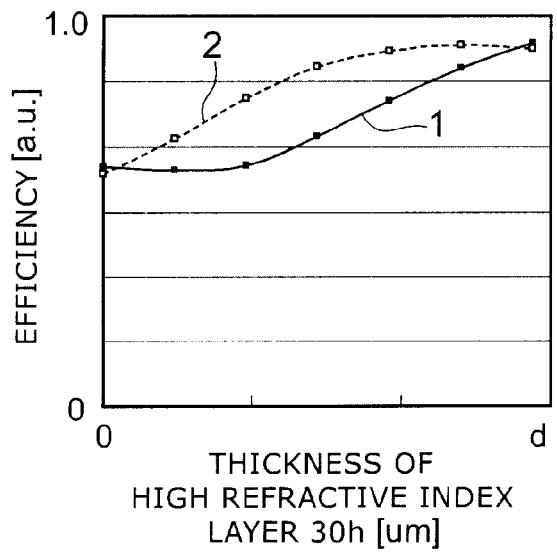
FIG. 7 is a diagram for describing a wave optics simulation result.

Next, FIG. 7 shows a wave optics simulation result for the solid-state imaging devices 1 and 2. Here, the horizontal axis of FIG. 7 represents the thickness of the high refractive index layer 30h buried in the trench 60 having depth d (μm), and the vertical axis represents light receiving efficiency (normalized value, a.u.) for light focused on the photodiode 70. For instance, when the thickness of the high refractive index layer 30h is 0 μm, the trench 60 is entirely filled with the low refractive index layer 30l. When the thickness of the high refractive index layer 30h is d μm, the trench 60 is entirely filled with the high refractive index layer 30h. Here, d (μm) may refer to the thickness of the optical waveguides 30 and 31.

First, it was found that in the solid-state imaging device 1, if the thickness of the high refractive index layer 30h is ½ or more of the depth d of the trench 60 (or the optical waveguide 30), then the light receiving efficiency increases relative to that in the state of the trench 60 entirely filled with the low refractive index layer 30l. It was also found that if the thickness of the high refractive index layer 30h is ⅔ or more of the depth d of the trench 60, then the light receiving efficiency tends to further increase. Hence, in the solid-state imaging device 1, it was found that to improve the light receiving efficiency, the high refractive index layer 30h needs to have a thickness of ½ or more, and preferably ⅔ or more, of the depth d of the trench 60.

In the solid-state imaging device 2, until the thickness of the high refractive index layer 30h reaches ½ of the depth d of the trench 60 (or the optical waveguide 30), the light receiving efficiency gradually increases with the thickness. Then, it was found that if the thickness of the high refractive index layer 30h is ½ or more of the depth d of the trench 60, the light receiving efficiency is saturated while maintaining its high value. Hence, in the solid-state imaging device 2, it was found that to improve the light receiving efficiency, the high refractive index layer 30h needs to have a thickness of, preferably, ½ or more of the depth d of the trench 60.

It is noted that the polymer organic material may be a high refractive index organic material having a refractive index higher than approximately 1.6. However, if a high refractive index polymer organic material is directly used, then because of its high viscosity, the filling and coverage capability in the trench 60 may be lower than that of the aforementioned polymer organic material (with a refractive index of approximately 1.6). In such cases, fine particles (nano-ceramic particles) of a metal oxide, such as titanium oxide ($TiO_2$), can be dispersed in the high refractive index polymer organic material. Such metal oxide fine particles (with a grain size of several ten to several hundred nm) mixed in the high refractive index polymer organic material improve the filling and coverage capability even in the trench 60 with high aspect ratio. Such a method is also encompassed in this embodiment.

Fourth Embodiment

Next, solid-state imaging devices according to still another embodiment are described. The solid-state imaging devices described below correspond to structures in which the aforementioned scaling effect is further enhanced. Although the structure of the solid-state imaging element is described below by taking the optical waveguide 31 as an example, the optical waveguide 31 may be replaced by the optical waveguide 30.

Figure 8A:
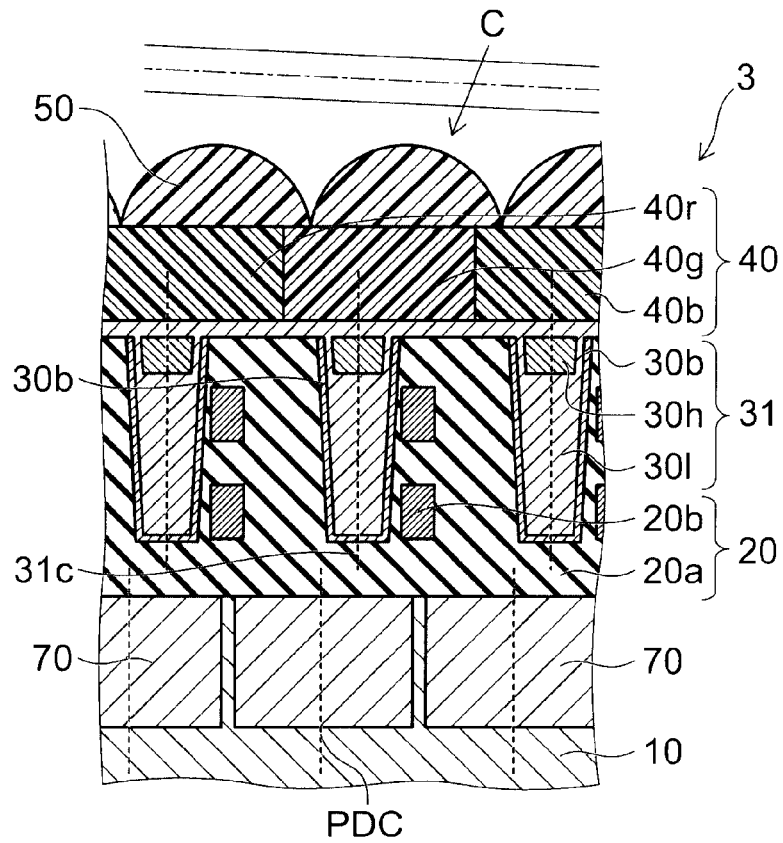
FIGS. 8A and 8B are schematic views of the relevant part of solid-state imaging devices according to an embodiment.
Figure 8B:
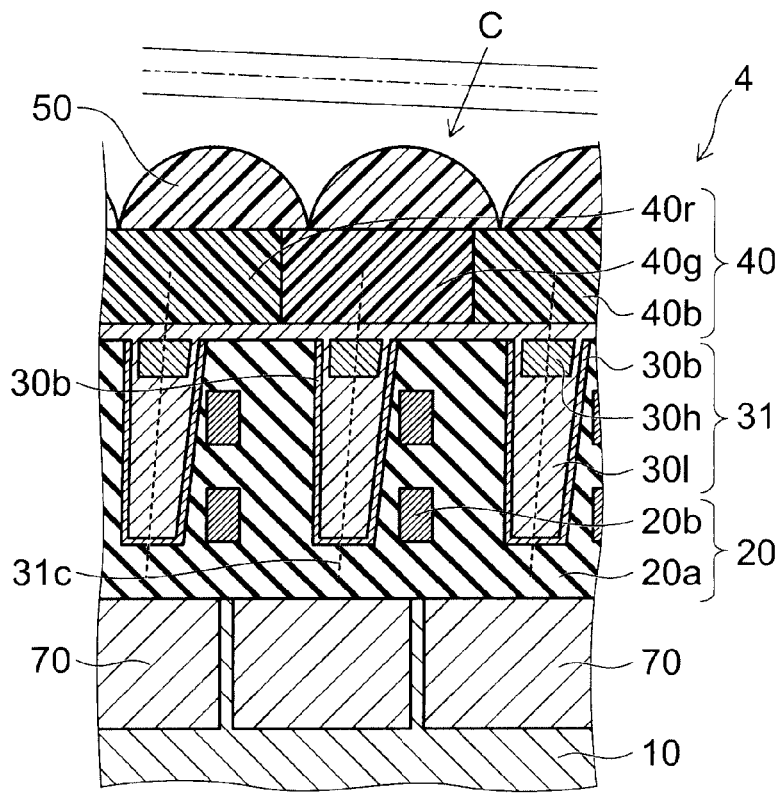

FIGS. 8A and 8B are schematic views of the relevant part of solid-state imaging devices according to another embodiment.

For instance, in a solid-state imaging device 3 shown in FIG. 8A, the central axis 31c of the optical waveguide 31 is shifted from the central axis PDC of the photodiode 70 toward the light beam C obliquely incident on the microlens 50. Furthermore, the optical waveguide 31 is not in contact with the wiring 20b. In such a configuration, in addition to the aforementioned effect, the light beam obliquely incident at a large incident angle through the imaging lens (not shown) toward the microlens 50 can be efficiently focused on the photodiode 70.

In a solid-state imaging device 4 shown in FIG. 8B, the central axis 31c of the optical waveguide 31 is inclined with respect to the major surface of the substrate 10 toward the light beam C obliquely incident on the microlens 50. Furthermore, the optical waveguide 31 is not in contact with the wiring 20b. Also in such a configuration, in addition to the aforementioned effect, the light beam obliquely incident at a large incident angle through the imaging lens toward the microlens 50 can be efficiently focused on the photodiode 70.

Figure 9A:
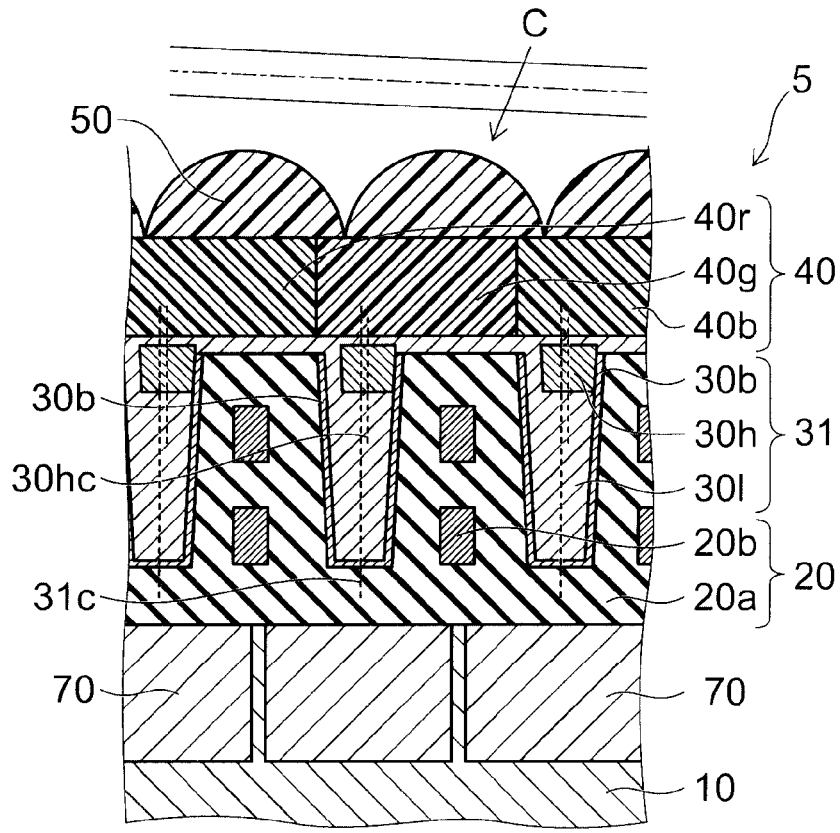
FIGS. 9A and 9B are schematic views of the relevant part of another solid-state imaging device according to the embodiment.
Figure 9B:
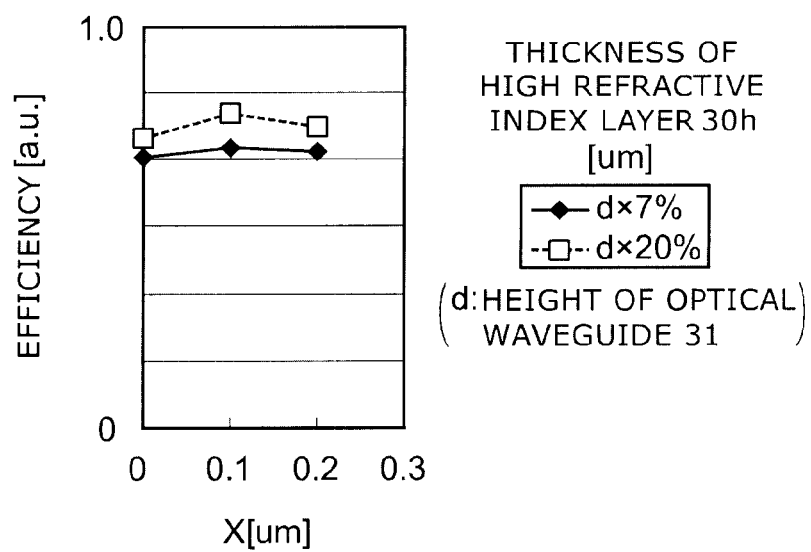

FIGS. 9A and 9B are schematic views of the relevant part of another solid-state imaging device according to this embodiment.

In a solid-state imaging device 5 shown in FIG. 9A, the central axis 30hc of the high refractive index layer 30h in the optical waveguide 31 is shifted from the central axis 31c of the optical waveguide 31 toward the light beam C obliquely incident on the microlens 50. Furthermore, the optical waveguide 31 is not in contact with the wiring 20b. Also in such a configuration, in addition to the aforementioned effect, the light beam obliquely incident at a large incident angle through the imaging lens toward the microlens 50 can be efficiently focused on the photodiode 70.

FIG. 9B shows a result of simulation for light receiving efficiency using the solid-state imaging device 5 in which scaling is performed. Here, the horizontal axis represents the distance X (μm) by which the central axis 30hc of the high refractive index layer 30h in the optical waveguide 31 is shifted from the central axis 31c of the optical waveguide 31, and the vertical axis represents light receiving efficiency (normalized value, a.u.). The calculation results are illustrated for a high refractive index layer 30h whose thickness is 7% of the thickness d of the optical waveguide 31, and for a high refractive index layer 30h whose thickness is 20% of the thickness of the optical waveguide 31.

As shown, increase in light receiving efficiency was observed when the shifted distance X was approximately 0.1 μm. Hence, also in such a configuration, in addition to the aforementioned effect, the light beam obliquely incident at a large incident angle through the imaging lens toward the microlens 50 can be efficiently focused on the photodiode 70.

The embodiments of the invention have been described with reference to examples. However, the embodiments are not limited to these examples. That is, those skilled in the art can suitably modify the above examples, and such modifications are also encompassed within the scope of the invention as long as they fall within the spirit of the invention. For instance, various components of the above examples and their layout, material, condition, shape, size and the like are not limited to those illustrated, but can be suitably modified.

Furthermore, the components of the above embodiments can be combined with each other as long as technically feasible, and such combinations are also encompassed within the scope of the invention as long as they fall within the spirit of the invention.

Furthermore, those skilled in the art could conceive various modifications and variations within the spirit of the invention, which are also encompassed within the scope of the invention.

The invention claimed is:

1. A solid-state imaging device comprising:
a substrate including a plurality of light receiving sections;
an optical waveguide provided above each of the plurality of light receiving sections and surrounded by a cladding layer;
a color filter provided above each of the optical waveguides; and
a lens provided above the color filter,
the optical waveguide including a first layer having a first refractive index and a second layer being in contact with the first layer and having a second refractive index higher than the first refractive index,
a lower end of the second layer being positioned lower than an upper end of the cladding layer and a lower end of the first layer being positioned higher than a lower end of the cladding layer,
a thickness of the second layer being ½ or more of a thickness of the optical waveguide, and
the second layer improving a total reflection effect of light guided in the optical waveguide.

2. The device according to claim 1, wherein the optical waveguide is formed by stacking the first layer on the second layer.

3. The device according to claim 2, wherein a thickness of the second layer is ⅔ or more of a thickness of the optical waveguide.

4. The device according to claim 1, wherein a central axis of the optical waveguide is shifted from a central axis of a corresponding one of the light receiving sections.

5. The device according to claim 1, wherein a central axis of the optical waveguide is inclined with respect to a major surface of the substrate.

6. The device according to claim 1, wherein a central axis of the second layer is shifted from a central axis of the optical waveguide.

7. The device according to claim 1, wherein
the first layer is composed primarily of an organic resin, and
the second layer is composed primarily of silicon nitride.

8. The device according to claim 7, wherein the first layer is composed primarily of a thermosetting polymer organic material (with a refractive index of approximately 1.6), the thermosetting polymer organic material including at least one of a polyimide resin, poly(benzyl methacrylate), poly(phenyl methacrylate), poly(diallyl phthalate), and polystyrene.

9. The device according to claim 7, wherein a metal oxide fine particle is dispersed in the organic resin.

10. The device according to claim 9, wherein the metal oxide fine particle has a grain size of several ten to several hundred nm.

11. The device according to claim 9, wherein the metal oxide fine particle is composed primarily of titanium oxide.

12. The device according to claim 1, wherein the optical waveguide is arranged in a lattice or honeycomb pattern with respect to a major surface of the substrate.

\* \* \* \* \*